(12) United States Patent
Swartzlander et al.

(10) Patent No.: US 10,608,639 B2
(45) Date of Patent: Mar. 31, 2020

(54) MEMRISTOR-BASED DIVIDERS USING MEMRISTORS-AS-DRIVERS (MAD) GATES

(71) Applicant: Board of Regents, The University of Texas System, Austin, TX (US)

(72) Inventors: Earl Swartzlander, Austin, TX (US); Lauren Guckert, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 16/560,101

(22) Filed: Sep. 4, 2019

(65) Prior Publication Data

US 2020/0014388 A1 Jan. 9, 2020

Related U.S. Application Data

(60) Continuation of application No. 16/384,735, filed on Apr. 15, 2019, now Pat. No. 10,447,271, which is a
(Continued)

(51) Int. Cl.
*H03K 19/177* (2006.01)
*G06F 7/507* (2006.01)
(Continued)

(52) U.S. Cl.
CPC ............ *H03K 19/177* (2013.01); *G06F 7/501* (2013.01); *G06F 7/507* (2013.01); *G06F 7/535* (2013.01);
(Continued)

(58) Field of Classification Search
CPC ............ G11C 13/0004; G11C 13/0069; H03K 19/1776
See application file for complete search history.

(56) References Cited

U.S. PATENT DOCUMENTS 7,902,857 B1 3/2011 Pino
8,525,553 B1 * 9/2013 Yi .......................... H03K 3/313
326/132
(Continued)

FOREIGN PATENT DOCUMENTS

WO 2017144862 A1 8/2017

OTHER PUBLICATIONS

Bickerstaff et al., "Memristor-based Arithmetic," Conference Record of the 44th Asilomar Conference on Signals, Systems and Computers (ASILOMAR), Pacific Grove, CA, United States, Nov. 7-10, 2010, pp. 1173-1177.
(Continued)

*Primary Examiner* — Jason Crawford
(74) *Attorney, Agent, or Firm* — Robert A. Voigt, Jr.; Winstead PC

(57) ABSTRACT

Memristor-based dividers using memristors-as-drivers (MAD) gates. As a result of employing MAD gates in memristor-based dividers, such as binary non-restoring dividers and SRT dividers, the number of delay steps may be less than half than the number of delay steps required in traditional CMOS implementations of dividers. Furthermore, by using MAD gates, memristor-based dividers can be implemented with less complexity (e.g., fewer memristors and drivers). As a result, by the memristor-based dividers using MAD gates, the speed and complexity of a wide variety of arithmetic operations is improved.

9 Claims, 7 Drawing Sheets

Related U.S. Application Data division of application No. 16/114,956, filed on Aug. 28, 2018, now Pat. No. 10,305,484.

(60) Provisional application No. 62/556,084, filed on Sep. 8, 2017.

(51) Int. Cl.
*H03K 19/20* (2006.01)
*G06F 7/535* (2006.01)
*G06F 7/501* (2006.01)

(52) U.S. Cl.
CPC ..... *H03K 19/20* (2013.01); *G06F 2207/4802* (2013.01)

(56) References Cited

U.S. PATENT DOCUMENTS

| | | | |
|---|---|---|---|
| 8,773,167 | B2 | 7/2014 | Robinett et al. |
| 9,685,954 | B2* | 6/2017 | Kvatinsky ........ H03K 19/00346 |
| 9,921,808 | B1* | 3/2018 | Swartzlander .......... G06F 7/501 |
| 9,971,564 | B1* | 5/2018 | Swartzlander .......... G06F 7/501 |
| 10,169,297 | B2 | 1/2019 | Buchanan |
| 10,180,820 | B2 | 1/2019 | Buchanan et al. |
| 10,305,484 | B2* | 5/2019 | Swartzlander .......... G06F 7/507 |
| 10,447,271 | B2* | 10/2019 | Swartzlander .......... G06F 7/501 |
| 2011/0121359 | A1* | 5/2011 | Yang .................... H01L 29/861 257/109 |
| 2012/0014169 | A1 | 1/2012 | Snider |
| 2013/0311413 | A1 | 11/2013 | Rose et al. |
| 2013/0313623 | A1* | 11/2013 | Vrudhula ................ H01L 43/02 257/295 |
| 2014/0028347 | A1 | 1/2014 | Robinett et al. |
| 2015/0256178 | A1 | 9/2015 | Kvatinsky et al. |
| 2016/0020766 | A1 | 1/2016 | Miao et al. |
| 2016/0189772 | A1 | 6/2016 | Mohammad et al. |
| 2017/0243645 | A1* | 8/2017 | Chia ................. G11C 13/0007 |
| 2017/0317680 | A1* | 11/2017 | Ge ...................... H03K 19/173 |
| 2017/0337968 | A1 | 11/2017 | Jagtap |
| 2018/0159536 | A1* | 6/2018 | Swartzlander ....... H03K 19/173 |
| 2019/0079731 | A1* | 3/2019 | Swartzlander .......... G06F 7/523 |
| 2019/0081628 | A1* | 3/2019 | Swartzlander ....... H03K 19/177 |

OTHER PUBLICATIONS

Kvatinsky et al., "Memristor-Based Material Implication (IMPLY) Logic: Design Principles and Methodologies," IEEE Transactions on Very Large Scale Integration (VLSI) Systems, vol. 22, Issue 10, Oct. 2014, pp. 2054-2066.

Kvatinsky et al., "MAGIC—Memristor Aided LoGIC," IEEE Transactions on Circuits and Systems II: Express Briefs, vol. 61, Issue 11, Nov. 2014, pp. 895-899.

Mahajan et al., "Memristor Based Adders," Conference Record of the 48th Asilomar Conference on Signals, Systems and Computers, Pacific Grove, United States, Nov. 2-5, 2014, pp. 1256-1260.

Lauren C. Guckert, Memristor-Based Arithmetic Units, Ph.D. Defense, Oct. 28, 2016, pp. 1-166.

Kvatinsky et al., "MRL—Memristor Ratioed Logic," 13th International Workshop on Cellular Nanoscale Networks and Their Applications (CNNA), Aug. 29-31, 2012, pp. 1-6.

Teimoory et al., "Optimized Implementation of Memristor-Based Full Adder by Material Implication Logic," 21st IEEE International Conference on Electronics, Circuits and Systems (ICECS), Marseille, France, 2014, pp. 1-4.

Zhang et al., A Novel Design for Memristor-Based Logic Switch and Crossbar Circuits, IEEE Transactions on Circuits and Systems—I: Regular Papers, vol. 62, No. 5, May 2015, pp. 1402-1411.

Zhang et al., "A Novel Design for a Memristor-Based OR Gate," IEEE Transactions on Circuits and Systems—II: Express Briefs, vol. 62, No. 8, Aug. 2015, pp. 781-785.

Guckert et al., "MAD Gates—Memristor Logic Design Using Driver Circuitry," IEEE Transactions on Circuits and Systems II: Express Briefs, vol. PP, No. 99, Apr. 7, 2016, pp. 1-5.

Lauren Elise Guckert, "Memristor-Based Arithmetic Units," Dissertation Presented to the Faculty of the Graduate School of the University of Texas at Austin, Dec. 2016, pp. 1-255, see pp. 45-115.

Guckert et al., "MAD Gates—Memristor Logic Design Using Driver Circuitry," IEEE Transactions on Circuits and Systems II: Express Briefs, vol. 64, No. 2, Feb. 2017, pp. 1-5.

Guckert et al., "Optimized Memristor-Based Ripple Carry Adders," Asilomar Conference on Signals, Systems and Computers, Pacific Grove, California, United States of America, Nov. 8, 2016, pp. 1-5.

Shaltoot et al., "Memristor Based Carry Lookahead Adder Architectures," 2012 IEEE 55th International Midwest Symposium on Circuits and Systems (MWSCAS), Aug. 2012, pp. 298-301.

Revenna et al., "Memristor Based Adder Circuit Design," 2016 50th Asilomar Conference on Signals, Systems and Computers, Nov. 2016, pp. 162-166.

Haghiri et al., "A Memristor Based Binary Multiplier," 2017 IEEE 30th Canadian Confernece on Electrical and Computer Engineering, 2017, pp. 1-4.

Shin et al., "Resistive Computing: Memristors-Enabled Signal Multiplication," IEEE Transactions on Circuits and Systems—I: Regular Papers, vol. 60, No. 5, May 2013, pp. 1241-1249.

\* cited by examiner

MEMRISTOR-BASED DIVIDERS USING MEMRISTORS-AS-DRIVERS (MAD) GATES

TECHNICAL FIELD

The present invention relates generally to memristors, and more particularly to memristor-based dividers using memristors-as-drivers (MAD) gates to improve the speed and complexity of arithmetic operations.

BACKGROUND

Memristors were first hypothesized by Leon Chua in 1971, and since then research has explored the potential for these devices in modern system design. The most direct benefits of memristors, low area and high density, lend themselves to improved memory design, sparking the majority of prior research. Only recently has research begun to explore the use of memristors in arithmetic applications. The work that has been done has focused on individual logic gates and small circuits. There have been numerous approaches to this endeavor: IMPLY operations, MAGIC gates, logic-in-memory, hybrid-CMOS gates, and threshold gates, to name the most prevalent.

Unfortunately, each prior approach to memristor-based logic has shortcomings. IMPLY gates are serialized and incur high delays for Boolean operations. Hybrid-CMOS gates suffer from signal degradation. MAGIC gates and logic-in-memory designs are limited in applications since they cannot be concatenated or provide multiple fanout. Threshold gates using GOTO pairs, although low in area and delay, are still in their infant stages in terms of fabrication.

Hence, all prior designs for memristor-based gates have had shortcomings in terms of scalability, applicability, completeness and performance. For example, dividers using memristor-based gates have shortcomings in terms of delay and complexity (many transistors, memristors, switches and/or drivers).

SUMMARY

In one embodiment of the present invention, a binary non-restoring divider comprises a first memristor, where the first memristor is connected to a first switch, a second switch, a third switch, a fourth switch, a fifth switch and a sixth switch. The binary non-restoring divider further comprises a second memristor connected in parallel to the first memristor, where the second memristor is connected to a seventh switch, and where an eighth switch is connected to the first and second memristors. The binary non-restoring divider additionally comprises a third memristor connected in parallel to the second memristor, where the third memristor is connected to a ninth switch, a tenth switch and an eleventh switch. Furthermore, the binary non-restoring divider comprises a fourth memristor connected in parallel to the third memristor, where the fourth memristor is connected to a twelfth switch, a thirteenth switch, a fourteenth switch, a fifteenth switch, a sixteenth switch and a seventeenth switch.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which.

DETAILED DESCRIPTION

In the following description, numerous specific details are set forth to provide a thorough understanding of the present invention. However, it will be apparent to those skilled in the art that the present invention may be practiced without such specific details. In other instances, well-known circuits have been shown in block diagram form in order not to obscure the present invention in unnecessary detail. For the most part, details considering timing considerations and the like have been omitted inasmuch as such details are not necessary to obtain a complete understanding of the present invention and are within the skills of persons of ordinary skill in the relevant art.

As stated in the Background section, memristors have recently begun to be explored in arithmetic operations. However, all prior designs for memristor-based gates have had shortcomings in terms of scalability, applicability, completeness and performance. For example, dividers using memristor-based gates have shortcomings in terms of delay and complexity (many transistors, memristors, switches and/or drivers).

The principles of the present invention provide a new lower-power gate design, Memristors-As-Drivers gates (hereinafter "MAD" gates), which overcomes each of these issues by combining sense circuitry with the IMPLY operation. By using such MAD gates, memristor-based dividers can be implemented with less complexity (e.g., fewer memristors and drivers) and delay. A discussion regarding the various types of memristor-based dividers using MAD gates, such as binary non-restoring dividers and SRT (Sweeney, Robertson, and Tocher) dividers, is provided below.

The MAD approach to a binary non-restoring divider allows for heavy optimizations. In one embodiment, the binary non-restoring divider of the present invention only requires a single N-bit ripple carry adder and an N-bit register.

The N-bit register holds the current quotient as it is resolved one bit at a time across the iterations. Note that this N-bit register replaces an original design's 2N-bit shift register. Not only does the register have half the width, it does not need the shift logic. In one embodiment, the shift logic can be removed by changing the destination drivers for store operations. The N bits of the shift register for the running sum can be removed by storing the running sum directly back into the adder itself.

The binary non-restoring divider also has the 2's complement, multiplexer, and quotient conversion logic. The discussion below will focus on optimizations that can be performed on these logic blocks. Specifically, the multiplexer, shift, 2's complement and quotient conversion logic can all be performed within a single MAD adder. The driver circuitry is changed slightly from the standard ripple carry adder to accommodate these optimizations.

Figure 2A:
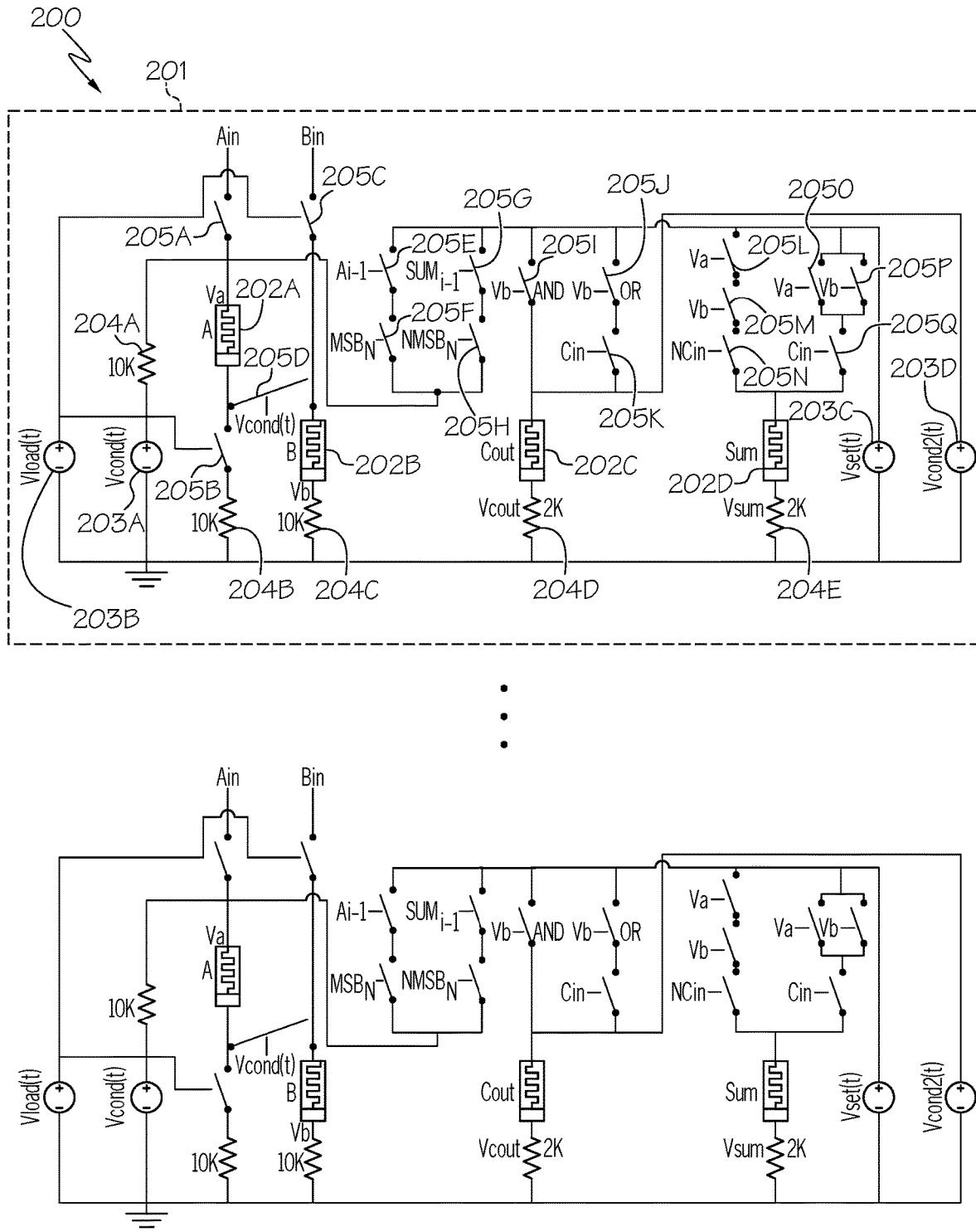
FIGS. 2A-2B illustrate the full schematic for an 8-bit MAD binary non-restoring divider in accordance with an embodiment of the present invention.
Figure 2B:
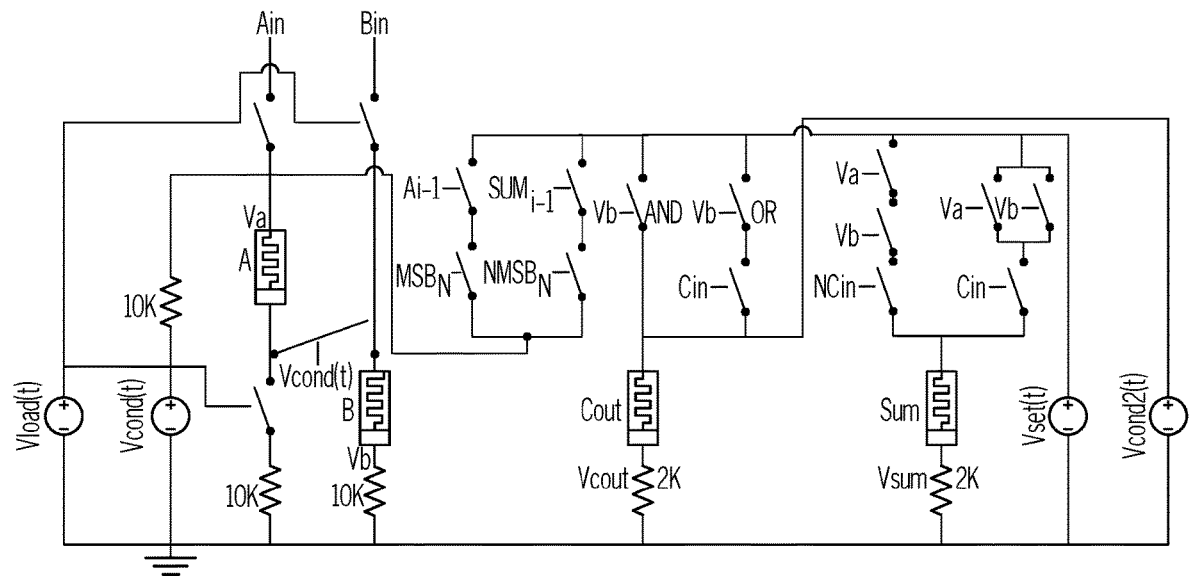
Figure 2B:
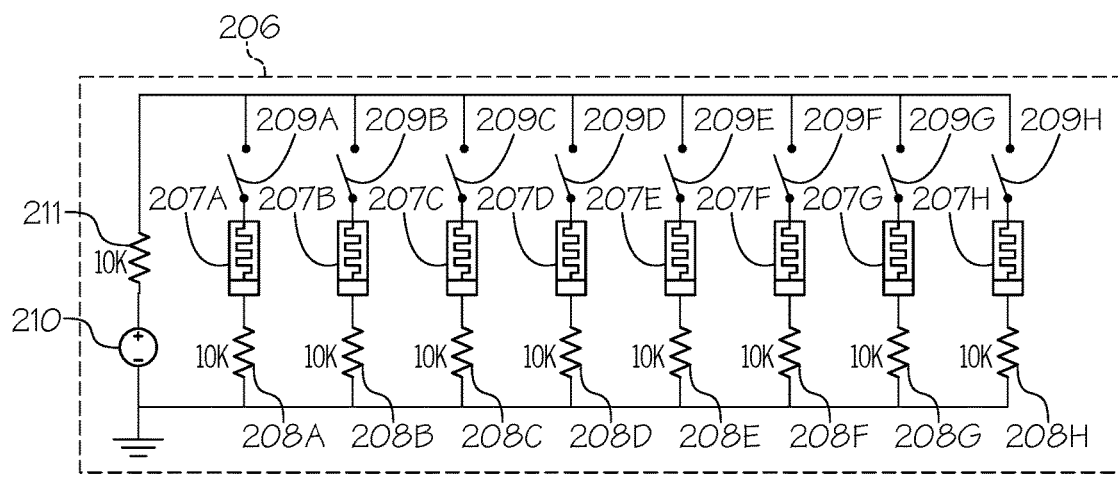

First, with respect to the initial 2's complement operation, the adder is loaded with the inverse of the divisor in the B memristors (shown in FIGS. 2A-2B) and 0 in the A memristors (shown in FIGS. 2A-2B). Then, a carry-in of 1 is driven to bit 0 and the 2's complement completes in N steps. The value is then copied back to the B memristors using a reset and single-step MAD copy operation. The value in the B memristors will then remain through all of the iterations of the addition until the final quotient conversion. In all, the 2's complement requires N+3 steps for the initialization, addition and copy. No changes to the circuitry are required to enable this since it is a standard addition.

Secondly, the adder is adapted to logically shift the result of the subtraction left. The sum from each bit i's full adder will be (conditionally) stored into the input operand A in bit i+1 instead.

In each iteration, the final full adder bit in the ripple carry adder executes and resolves its most significant bit in N steps. This sum in turn can drive the resolution of the remaining sum bits as they are shifted and stored back into the A memristors. Before this can occur, the input A memristors are cleared so they can accept the new value.

Let each full adder reset all of its internal memristors except the A and sum memristors (shown in FIGS. 2A-2B) during its idle stages. All of the full adders except the Nth have at least one idle step to perform this reset. In step N+1, all of the full adders copy their A memristors to the $C_{out}$ memristor (shown in FIGS. 2A-2B) in the full adder. This is purely to move the value out of the A memristors which serve as the destination during the shift operation. In Step N+2, the A memristors are reset and in step N+3 the shift operation occurs.

If the most significant bit has a sum of 0, the drivers drive the result of the sum in the (i−1)th adder into the A memristor in the ith adder. If the most significant bit has a sum of 1, the drivers drive the input A memristor in the (i−1)th adder into the A memristor in the ith adder. Either way, a left shift operation executes.

The driver logic is adapted to support this multiplexer logic. A $V_{cond}$ read voltage (shown in FIGS. 2A-2B) is applied to both the $C_{out}$ memristor (holds A value now) and the sum memristor in the (i−1)th adder at the same time a $V_{set}$ voltage (shown in FIGS. 2A-2B) is applied to the A memristor in the ith adder. The $V_{set}$ voltage will be gated by two parallel paths, each with two switches.

The first path's gates will be driven by the n-terminal of the Nth full adder's sum memristor and the p-terminal of the (i−1)th full adder's sum memristor. This essentially performs $\overline{MSB}_n$ AND $Sum_{i-1}$.

Figure 1:
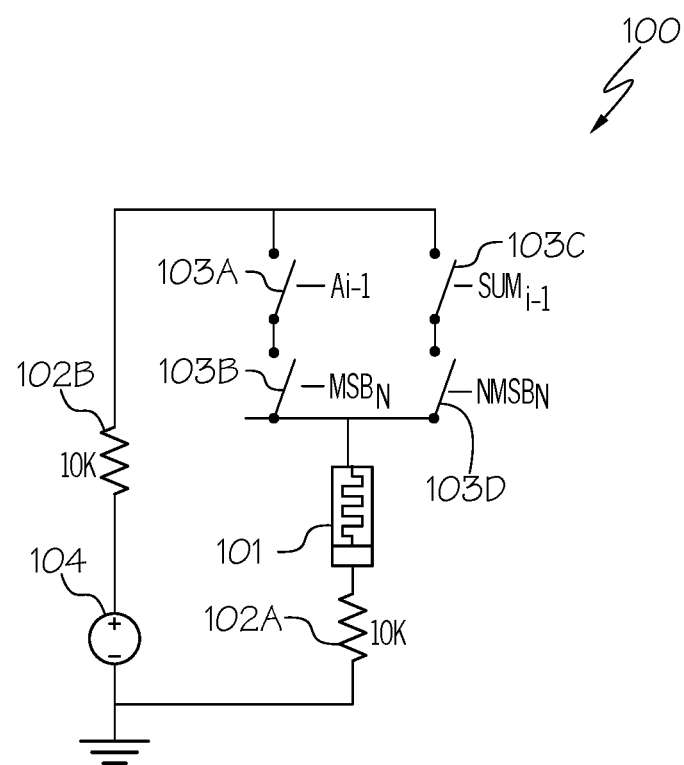
FIG. 1 illustrates the logic for performing the shift operation in a MAD binary non-restoring divider in accordance with an embodiment of the present invention.

The second path's gates will be driven by the p-terminal of the Nth full adder's sum memristor and the p-terminal of the (i−1)th full adder's A value in the $C_{out}$ memristor. This essentially performs $MSB_N$ AND $A_{i-1}$. The schematic for this logic for two consecutive full adders is shown in FIG. 1. FIG. 1 illustrates the logic 100 for performing the shift operation in a MAD binary non-restoring divider in accordance with an embodiment of the present invention.

Referring to FIG. 1, logic 100 includes a memristor 101 connected to ground via resistor 102A (value of 10K ohms in one embodiment). Memristor 101 is further connected to switches 103A, 103B, 103C and 103D, where switches 103A, 103B are connected in series and switches 103C, 103D are connected in series. Furthermore, the combination of switches 103A, 103B is connected in parallel to the combination of switches 103C, 103D. Additionally, switches 103A, 103C are directly connected to a power source 104 via resistor 102B (value of 10K ohms in one embodiment). Power source 104A is connected to ground.

In this manner, the multiplexer and shift logic are incorporated into the adders. This adds four switches to each full adder in the design for a total of 17N switches. After step N+3, the updated dividend value exists in all of the full adders.

The quotient bit is stored in the manner discussed below. A Most Significant Bit (MSB) of '1' is stored as a '0' in the quotient memristor and a MSB of '0' is stored as a '1'. This can be achieved with a NOT operation on the MSB in parallel to the shift operation. This updates the quotient bit according to the result's sign. Now, the design simply resets all working memristors in preparation for the next iteration.

The final quotient conversion requires a copy operation from the quotient register to the adder and an N-bit addition for a total of N+1 steps. The initial 2's complement uses N+3 steps, the delay of each iteration is N+3 steps, and the delay of the final quotient conversion is N+1 steps. The total delay for the binary non-restoring divider is (N+3)(N+3)−2. Note that it is not possible to pipeline divisions since the circuitry is already pipelined for the individual iterations. The full schematic for an 8-bit MAD binary non-restoring divider 200 is shown in FIGS. 2A-2B in accordance with an embodiment of the present invention.

Referring to FIG. 2A, 8-bit MAD binary non-restoring divider 200 includes circuitry 201 that includes memristors 202A, 202B connected in parallel. Memristor 202A is connected to power source 203A (Vcond(t)) via resistor 204A (value of 10K ohms in one embodiment). Memristor 202A is further connected to a switch 205A. Furthermore, memristor 202A is connected to switch 205B, which is connected to ground via resistor 204B (value of 10K ohms in one embodiment). Additionally, switches 205A, 205B are connected to power source 203B (Vload(t)).

Memristor 202B is connected to ground via resistor 204C (value of 10K ohms in one embodiment). Furthermore, memristor 202B is connected to switch 205C which is connected to power source 203B (Vload(t)). Additionally, there is a switch 205D between memristors 202A, 202B which is driven by Vcond(t).

Furthermore, as shown in FIG. 2A, switches 205E, 205F, 205G and 205H are connected to memristor 202A. Switches 205E, 205F are connected in series and switches 205G, 205H are connected in series. Furthermore, the combination of switches 205E, 205F is connected in parallel to the combination of switches 205G, 205H.

Additionally, as shown in FIG. 2A, memristor 202C is connected in parallel to memristor 202B. Memristor 202C is connected to ground via resistor 204D (value of 2K ohms in one embodiment). Furthermore, memristor 202C is connected to switches 205I, 205J and 205K, where switches 205J, 205K are connected in series. Additionally, the combination of switches 205J, 205K is connected in parallel to switch 205I.

As also shown in FIG. 2A, switches 205E, 205G, 205I and 205J are connected to power source 203C (Vset(t)). Furthermore, memristor 202C is connected to power source 203D (Vcond2(t)).

Furthermore, as shown in FIG. 2A, memristor 202D is connected in parallel to memristor 202C. Memristor 202D is connected to switches 205L-205Q, where switches 205O and 205P are connected in parallel and the combination of switches 205O, 205P is connected in series with switch 205Q. Furthermore, switches 205L, 205M and 205N are connected in series, where the combination of switches 205L, 205M and 205N is connected in parallel to the combination of switches 205O, 205P and 205Q. Additionally, switches 205L, 205O and 205P are connected to power source 203C (Vset(t)).

Since MAD binary non-restoring divider 200 is an 8-bit divider, circuitry 201 is replicated eight times as partially shown in FIGS. 2A-2B.

Additionally, as shown in FIG. 2B, divider 200 includes circuitry 206 that includes memristors 207A-207H that are connected to ground via resistors 208A-208H, respectively (value of 10K ohms in one embodiment). Furthermore, memristors 207A-207H are connected to switches 209A-209H, respectively, which are connected to a power source 210 via resistor 211 (value of 10K ohms in one embodiment).

Another type of divider using the MAD implementation is the SRT divider as discussed below.

As discussed below, the MAD implementation of the SRT divider involves enhancing an optimized ripple carry adder to perform a left-shift of the result at the end of each iteration. Secondly, the SRT divider of the present invention holds both the 2's complement of the divisor and the divisor in N-bit registers. Thirdly, a 4-to-1 multiplexer is used to select either the divisor, the 2's complement of the divisor, or the value 0 as the B operand in each iteration. Lastly, the SRT divider of the present invention includes logic for on-the-fly quotient conversion.

As discussed above, the SRT divider of the present invention includes shift functionality. As described for the binary non-restoring divider, it is possible to perform a left-shift operation without any additional memristors or delay to the adder design. This is done by performing the final set operation for the sum resolution by applying the $V_{set}$ voltage to a destination memristor in the next full adder rather than the local full adder.

The additional logic to make this a conditional store in the binary non-restoring divider is no longer needed in the SRT divider. Thus, each bit full adder f only needs to wait for full adder f+1 to reset its A memristor (shown in FIGS. 5A-5B) operand before performing the final store. However, this is a special case for the MAD adder. The A memristor in full adder f+1 is required to resolve its own carry-out and sum. Thus, each full adder f cannot store its sum into full adder f+1 until f+1 resets it's A memristor, but f+1 cannot reset its A memristor until it stores its own sum into full adder f+2. This creates a forward dependency across the adders. Thus, it is not possible to perform this left shift seamlessly.

Figure 5A:
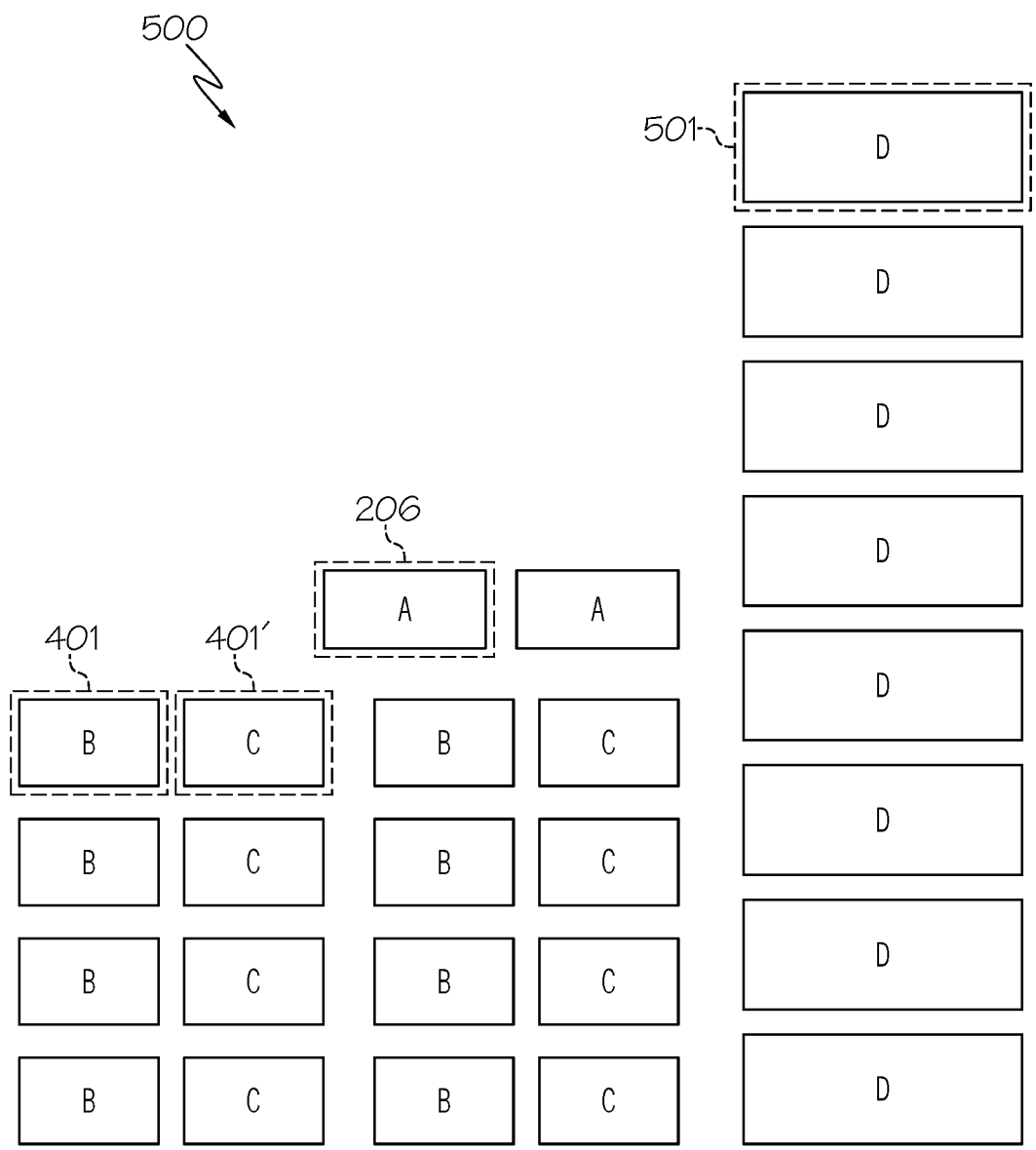
FIGS. 5A and 5B illustrate an 8-bit MAD SRT divider in accordance with an embodiment of the present invention.
Figure 5B:
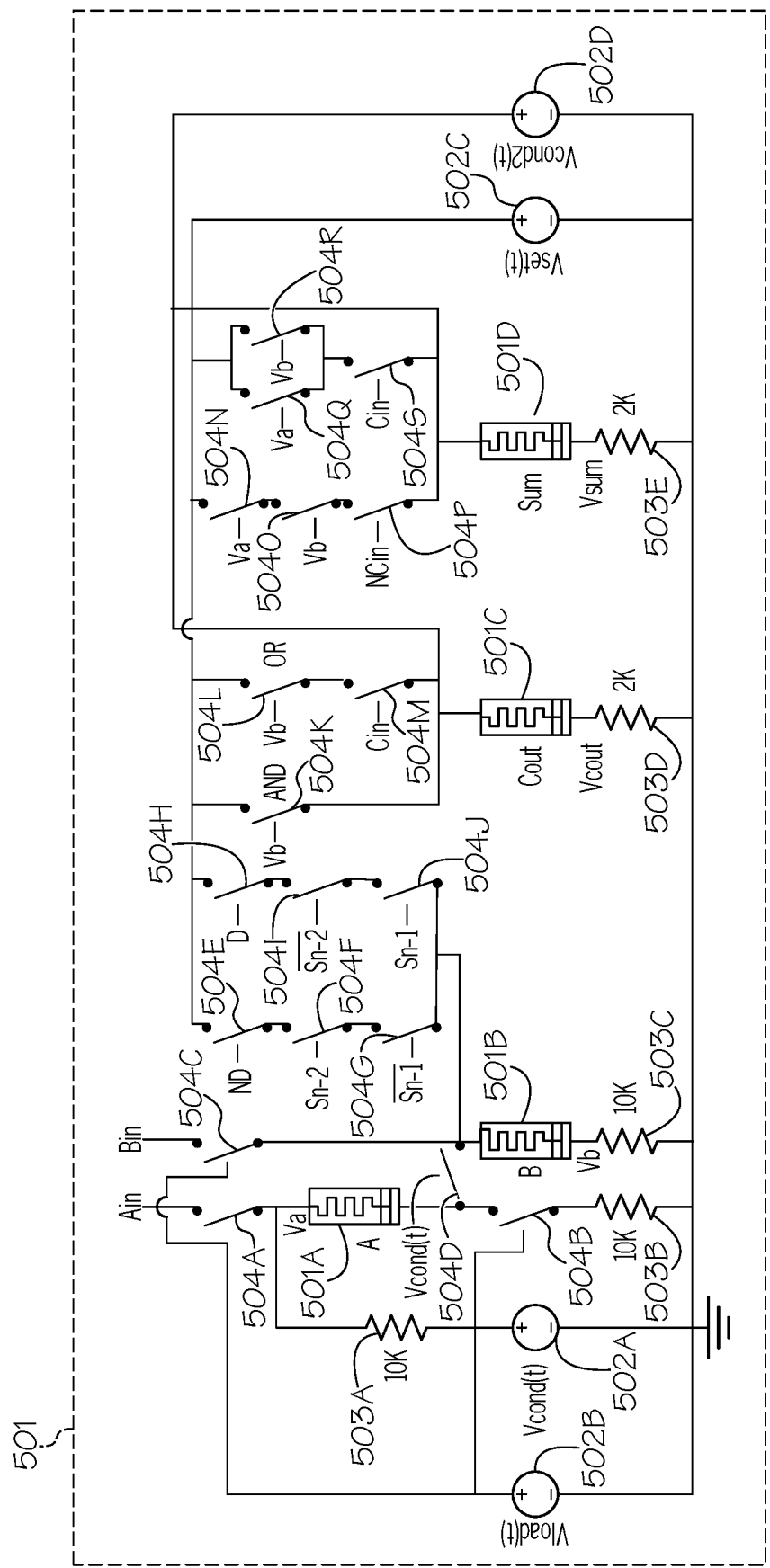

Instead, each full adder f in the MAD ripple carry adder will store the sum value directly into its own sum memristor (shown in FIGS. 5A-5B). Then, once the next full adder completes and resets its A memristor, f will perform a copy operation of its sum memristor into the A memristor. This copy step can occur during the idle steps while the remainder of the adder completes. One consequence is that one can no longer remove the sum memristors as is traditionally done when performing iterative additions. The updated steps for the first three full adders in the ripple carry adder are shown below in Table 1.

TABLE 1

Steps for Full adders in a MAD Shift Adder for an SRT Divider

| Step | Full adder 0 | Full adder 1 | Full adder 2 |
|---|---|---|---|
| 1 | Resolve $C_{out}$ and sum | | |
| 2 | Propagate $C_{out}$ | Resolve $C_{out}$ and sum | |
| 3 | Reset A | Propagate $C_{out}$ | Resolve $C_{out}$ and sum |
| 4 | Resolve shifted sum into A | Reset A | Propagate $C_{out}$ |
| 5 | Copy from sum | Copy into A from Full adder 0 | Reset A |
| 6 | | Copy from sum | Copy into A from Full adder 1 |

One can assume the original inputs are loaded into A and B a priori. In the first step, full adder 0 resolves its sum and carry-out signal. In step 2, full adder 0 propagates its carry-out to full adder 1 and full adder 1 resolves its sum and carry-out signal. In step 3, full adder 1 propagates its carry-out signal to full adder 2 and full adder 2 resolves its sum and carry-out signal. These steps are identical to the traditional ripple carry adder. Now, each full adder performs a third step after they have propagated their carry signal that resets the A memristor. Then, the sums are copied one by one from each full adder to the next full adder's A memristor.

The updated adder with support for the left shift operation takes N+3 steps. The shift operation essentially adds three steps to the critical path of the adder. The complexity remains unchanged.

Furthermore, the SRT divider includes registers for the divisor and its 2's complement. Each register requires N bits for a total complexity of 2N memristors, 2N switches and 2N drivers. These registers simply support read and write operations so their circuitry is minimal and straightforward. The same ripple carry adder can be used to complete the 2's complement of the divisor. When the store operation for the sum occurs in each full adder, it will apply $V_{set}$ to the corresponding memristor in the 2's complement register rather than a memristor in the local adder.

Figure 3:
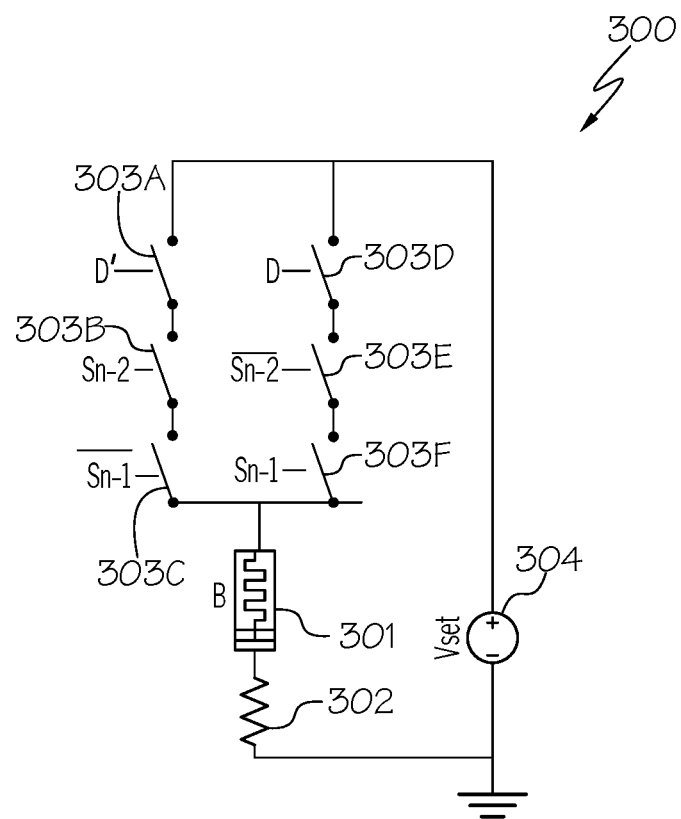
FIG. 3 illustrates the multiplexer logic for the 4-to-1 multiplexer in the SRT divider in accordance with an embodiment of the present invention.

Additionally, the SRT divider includes multiplexer logic to select between the divisor, 2's complement of the divisor and 0 for the B operand in each iteration. The logic to load the B operand memristor is enhanced as shown in FIG. 3. FIG. 3 illustrates multiplexer logic 300 for the 4-to-1 multiplexer in the SRT divider in accordance with an embodiment of the present invention.

Referring to FIG. 3, logic 300 includes a memristor 301 connected to ground via resistor 302. Memristor 301 is further connected to switches 303A-303F, where switches 303A-303C are connected in series and switches 303D-303F are connected in series. Furthermore, the combination of switches 303A-303C is connected in parallel to the combination of switches 303D-303F. Furthermore, switches 303A, 303D are connected to a power supply 304 (Vset), which is connected to ground.

Referring to FIG. 3, $S_{n-2}$ and $S_{n-1}$ represent the select lines from the result of the previous iteration, D represents the divisor, and D' represents the 2's complement of the divisor. Recall that the values of $S_{n-2}$ and $S_{n-1}$ are equivalent to the values in the A memristors of the most significant two full adders once the shift has been performed. The multiplexer can sense these two A memristors to obtain the values of the select lines for the multiplexer.

The 4-to-1 multiplexer really only has two inputs, D and DI The other two inputs are 0 and correspond to a nop (NULL operation) in the MAD adder. Vset 304 will be applied to the B memristor (shown in FIGS. 5A-5B) if ($S_{n-2}$ AND $\overline{S_{n-1}}$ AND D') OR ($\overline{S_{n-2}}$ AND $S_{n-1}$ AND D). This is equivalent to the Boolean expression for the multiplexer.

The multiplexer logic adds 6N switches to the adder design and requires a single step. The read voltage $V_{cond}$ is applied to $A_{n-2}$ and $A_{n-1}$ while the $V_{set}$ voltage is applied to the B memristors in all N full adders. At the same time, the individual memristors in the N-bit registers for D and D' are also driven with the read voltage $V_{cond}$. The total complexity of the entire design so far is 6N memristors, 5N+1 drivers and 21N switches and the delay is N+4 steps per iteration.

Also, the SRT divider of the present invention performs the on-the-fly quotient conversion. The MAD-based approach to the on-the-fly conversion is able to greatly reduce the overhead in terms of both area and delay. To perform the on-the-fly conversion, the design has N memristors for the Q[j] value and N memristors for the QM[j] value. These memristors are used since they hold the values of Q and QM across iterations.

The Q and QM values can be computed in parallel with the 4-to-1 multiplexer functionality. This is convenient because both the multiplexer and the Q and QM values depend on the two most significant bits of the value S. These bits can be read once by both logic blocks in parallel.

The equations for Q and QM in iteration j are shown below.

$$Q[j+1]_0 = (S_{n-1}\overline{S_{n-2}}) \text{ OR } (\overline{S_{n-1}}S_{n-2})$$

$$QM[j+1]_0 = (S_{n-1}S_{n-2}) \text{ OR } (\overline{S_{n-1}}\overline{S_{n-2}})$$

$$Q[j]_{[j-1:1]} = (QM[j] \text{ AND } (S_{n-1}\overline{S_{n-2}})) \text{ OR } (Q[j] \text{ AND } \overline{(S_{n-1}\overline{S_{n-2}})})$$

$$QM[j]_{[j-1:1]} = (Q[j] \text{ AND } (\overline{S_{n-1}}S_{n-2})) \text{ OR } (QM[j] \text{ AND } \overline{(\overline{S_{n-1}}S_{n-2})})$$

Let us consider $Q[j]_{[j-1:1]}$. If the most significant bits of the sum are 2'b10, then $Q[j]_{[j-1:1]}$ is set to $QM[j]_{[j-1:1]}$. To perform this, the drivers of the $Q[j]_{[j-1:1]}$ memristors are driven by a $V_{reset}$ signal followed by a $V_{set}$ signal and the voltages of the terminals of the $QM[j]_{j-1:1}$ memristors are read by driving a $V_{cond}$ signal. Otherwise, the value of Q[j] keeps the Q[j] value.

Now let us consider $QM[j]_{[j-1:1]}$. If the most significant bits of the sum are 2'b01, then the drivers of the $QM[j]_{j-1:1}$ memristors are driven a $V_{reset}$ signal followed by a $V_{set}$ signal and the voltages of the terminals of the QM[j] memristors are read by driving a $V_{cond}$ signal. An example of this logic for QM[j] and Q[j] is shown in FIG. 4.

Figure 4:
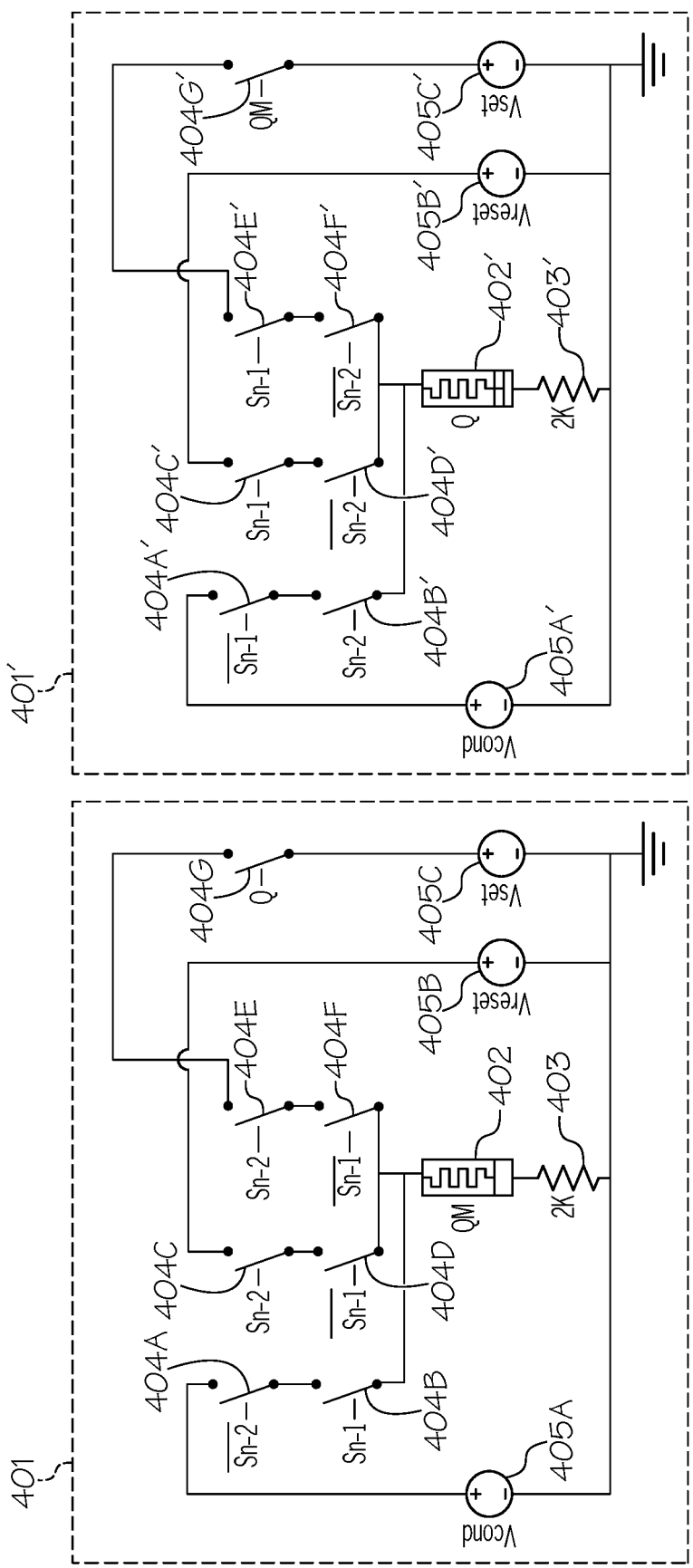
FIG. 4 illustrates the logic used for performing the on-the-fly conversion for a bit of QM[j] and Q[j] in the SRT divider in accordance with an embodiment of the present invention.

FIG. 4 illustrates the logic 400 used for performing the on-the-fly conversion for a bit of QM[j] and Q[j] in the SRT divider in accordance with an embodiment of the present invention.

Referring to FIG. 4, logic 400 includes circuitry 401 that includes a memristor 402 connected to ground via a resistor 403 (value of 2K ohms in one embodiment). Memristor 402 is connected to switches 404A-404F, where switches 404A, 404B are connected in series, switches 404C, 404D are connected in series and switches 404E, 404F are connected in series. Furthermore, as shown in FIG. 4, the combination of switches 404A, 404B is connected in parallel to the combination of switches 404C, 404D. Additionally, the combination of switches 404C, 404D is connected in parallel to the combination of switches 404E, 404F. Furthermore, as shown in FIG. 4, switch 404A is connected to power source 405A (Vcond), where power source 405A is connected to ground. Also, as shown in FIG. 4, switch 404C is connected to power source 405B (Vreset), where power source 405B is connected to ground. Furthermore, as shown in FIG. 4, switch 404E is connected to switch 404G, which is connected to power source 405C (Vset), which is connected to ground.

In one embodiment, logic includes two circuits 401 (the other one is signified as 401' with the same circuit elements as in circuit 401 with the designation of ') as shown in FIG. 4.

All of the bits of QM can share drivers and all of the bits of Q can share drivers since all bits perform in parallel. Thus, only six drivers are introduced to the design. Note that at most one of these events can occur so there is no risk of clearing out a memristor that would need to be read by its counterpart. This not only removes memristors intended for holding duplicates of these values prior to clearing the values but allows for parallelizing the resolution of QM[j] and Q[j]. Each memristor for the most significant j−1 bits requires seven switches for a total of 14(N−1) switches.

The resolution logic for $Q[j]_0$ and $QM[j]_0$ is simpler, sensing the same bits of the results as drivers but using XOR and XNOR gates, respectively. Thus, each memristor for the least significant bit of both QM and Q requires six switches. They can also share the drivers from the most significant bits of Q and QM. The total complexity of the on-the-fly quotient conversion is 2N memristors, 14N−2 switches and six drivers.

The on-the-fly conversion can complete in two steps, one for the reset operation and one for the set operation. These steps are overlapped with the multiplexer and addition functionality so the latency is hidden and does not lie on the critical path. Even the latency of the final iteration is hidden by the remainder correction.

The final remainder check and correction can be completed using the same single adder and 4-to-1 multiplexer. The delay is N steps. Before the addition, the B operand must be reset and loaded with either D or 0 depending on the most significant bit of the result $S_{n-1}$. If $S_{n-1}$ is '0', B remains '0' and if $S_{n-1}$ is '1', B is set to D. Essentially, B=$S_{n-1}$ AND D. This can be achieved with the circuitry for the 4-to-1 multiplexer in FIG. 4 by driving $S_{n-2}$ with '0'. This is achieved by only applying the $V_{cond}$ read signal to the most significant bit $S_{n-1}$ and not $S_{n-2}$. The remaining behavior is identical to the sense circuitry for the multiplexer as described. The complete schematic is shown in FIGS. 5A-5B. FIGS. 5A-5B illustrate an 8-bit MAD SRT divider 500 in accordance with an embodiment of the present invention.

Referring to FIGS. 5A-5B, the right column is the N-bit adder with the multiplexer logic. For example, divider 500 includes circuitry 501 that includes memristors 501A, 501B connected in parallel. Memristor 501A is connected to power source 502A (Vcond(t)) via resistor 503A (value of 10K ohms in one embodiment). Memristor 501A is further connected to a switch 504A. Furthermore, memristor 501A is connected to switch 504B, which is connected to ground via resistor 503B (value of 10K ohms in one embodiment). Additionally, switch 504A is connected to power source 502B (Vload(t)).

Memristor 501B is connected to ground via resistor 503C (value of 10K ohms in one embodiment). Furthermore, memristor 501B is connected to switch 504C which is connected to power source 502B (Vload(t)). Additionally, there is a switch 504D between memristors 501A, 501B which is driven by Vcond(t).

Furthermore, as shown in FIG. 5B, circuitry 501 includes switches 504E, 504F, 504G, 504H, 504I and 504J connected to memristor 501B. Switches 504E, 504F and 504G are connected in series and switches 504H, 504I and 504J are connected in series. The combination of switches 504E, 504F and 504G is connected in parallel to the combination of switches 504H, 504I and 504J. Switches 504E and 504H are connected to power source 502C (Vset(t)).

Additionally, as shown in FIG. 5B, circuitry 501 includes memristor 501C connected in parallel to memristor 501B. Memristor 501C is connected to ground via resistor 503D (value of 2K ohms in one embodiment). Furthermore, memristor 501C is connected to switches 504K, 504L and 504M, where switches 504L and 504M are connected in series and the combination of switches 504L and 504M is connected in parallel to switch 504K. Switches 504K and 504L are connected to power source 502C. Furthermore, memristor 501C is connected to power source 502D (Vcond2(t)).

Furthermore, as shown in FIG. 5B, circuitry 501 includes memristor 501D connected in parallel to memristor 501C. Memristor 501D is connected to ground via resistor 503E (value of 2K ohms in one embodiment). Furthermore, memristor 501D is connected to switches 504N, 504O, 504P, 504Q, 504R and 504S. Switches 504N, 504O and 504P are connected in series. Furthermore, switches 504Q and 504R are connected in parallel, where the combination of switches 504Q and 504R is connected in series with switch 504S. Additionally, the combination of switches 504N, 504O and 504P is connected in parallel with the combination of switches 504Q, 504R and 504S. Switches 504N, 504Q and 504R are connected to power source 502C. Furthermore, memristor 501D is connected to power source 502D (Vcond2(t)).

Since SRT divider 500 is an 8-bit divider, circuitry 501 is replicated eight times as shown in FIG. 5A.

Furthermore, as shown in FIG. 5A, the top of the left column are two N-bit registers for the divisor and 2's complement of the divisor (see circuitry 206 of divider 200 of FIGS. 2A-2B which is replicated twice in divider 500). The bottom of the left column is the N bits for the Q registers and N bits for the QM registers (see circuitry 401 and 401' as shown in FIG. 4). Since SRT divider 500 is an 8-bit divider, there are eight sets of circuitry 401, 401' as shown in FIG. 5A. Although not shown, drivers are shared across many of the instantiations as described. For example, all of the bits of the QM register can actually share their drivers since they act in lockstep in parallel.

The total complexity of the design is comprised of the registers, adder (with multiplexer logic) and on-the-fly quotient conversion. The registers, adder and multiplexer require 6N memristors, 21N switches and 5N+1 drivers. The quotient conversion requires 2N memristors, 14N−2 switches and six drivers. Thus, the total complexity is 8N memristors, 5N+7 drivers and 35N−2 switches.

The delay of each iteration is N+4 steps. Because of the optimizations performed, the on-the-fly quotient conversion can perform in parallel with the multiplexer logic and the first step of the adder without interference. The delay of the 2's complement addition and the remainder correction addition is N+1 steps each. Thus, the total delay of the MAD SRT divider is (X+2)(N+4)−6 steps.

As a result of employing MAD gates in memristor-based dividers, the number of delay steps may be less than half than the number of delay steps required in traditional CMOS implementations of dividers. Furthermore, by using MAD gates, memristor-based dividers can be implemented with less complexity (e.g., fewer memristors and drivers). As a result, by the memristor-based dividers using MAD gates, the speed and complexity of a wide variety of arithmetic operations is improved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A binary non-restoring divider, comprising:
a first memristor, wherein said first memristor is connected to a first switch, a second switch, a third switch, a fourth switch, a fifth switch and a sixth switch;
a second memristor connected in parallel to said first memristor, wherein said second memristor is connected to a seventh switch, wherein an eighth switch is connected to said first and second memristors;
a third memristor connected in parallel to said second memristor, wherein said third memristor is connected to a ninth switch, a tenth switch and an eleventh switch; and
a fourth memristor connected in parallel to said third memristor, wherein said fourth memristor is connected to a twelfth switch, a thirteenth switch, a fourteenth switch, a fifteenth switch, a sixteenth switch and a seventeenth switch.

2. The binary non-restoring divider as recited in claim 1, wherein said second switch is connected to ground via a resistor.

3. The binary non-restoring divider as recited in claim 1, wherein said first memristor is connected to a first power source via a resistor.

4. The binary non-restoring divider as recited in claim 1, wherein said first, second and seventh switches are connected to a second power source.

5. The binary non-restoring divider as recited in claim 1, wherein said third and fourth switches are connected in series, wherein said fifth and sixth switches are connected in series, wherein a combination of said third and fourth switches is connected in parallel to a combination of said fifth and sixth switches, wherein said tenth and eleventh switches are connected in series, wherein a combination of said tenth and eleventh switches is connected in parallel to said ninth switch.

6. The binary non-restoring divider as recited in claim 5, wherein said twelfth, thirteenth and fourteenth switches are connected in series, wherein said fifteenth and sixteenth switches are connected in parallel, wherein a combination of said fifteenth and sixteenth switches is connected in series with said seventeenth switch, wherein a combination of said twelfth, thirteenth and fourteenth switches is connected in parallel to a combination of said fifteenth, sixteenth and seventeenth switches.

7. The binary non-restoring divider as recited in claim 6, wherein said third, fifth, ninth, tenth, twelfth, fifteenth and sixteenth switches are connected to a third power source.

8. The binary non-restoring divider as recited in claim 7, wherein said third memristor is connected to a fourth power source.

9. The binary non-restoring divider as recited in claim 1 further comprising:
  a plurality of memristors, wherein each of said plurality of memristors is connected to ground via a resistor, wherein each of said plurality of memristors is connected to a switch which is connected to a power source.

* * * * *